(12) United States Patent
Lin et al.

(10) Patent No.: US 11,414,739 B2
(45) Date of Patent: Aug. 16, 2022

(54) MASK FRAME ASSEMBLY AND EVAPORATION DEVICE

(71) Applicants: BOE TECHNOLOGY GROUP CO., LTD., Beijing (CN); ORDOS YUANSHENG OPTOELECTRONICS CO., LTD., Inner Mongolia (CN)

(72) Inventors: Zhiming Lin, Beijing (CN); Zhen Wang, Beijing (CN); Jian Zhang, Beijing (CN)

(73) Assignees: BOE TECHNOLOGY GROUP CO., LTD., Beijing (CN); ORDOS YUANSHENG OPTOELECTRONICS CO., LTD., Ordos (CN)

( * ) Notice: Subject to any disclaimer, the term of this patent is extended or adjusted under 35 U.S.C. 154(b) by 1119 days.

(21) Appl. No.: 15/779,375

(22) PCT Filed: Dec. 6, 2017

(86) PCT No.: PCT/CN2017/114784
§ 371 (c)(1),
(2) Date: May 25, 2018

(87) PCT Pub. No.: WO2018/121196
PCT Pub. Date: Jul. 5, 2018

(65) Prior Publication Data
US 2021/0164087 A1    Jun. 3, 2021

(30) Foreign Application Priority Data
Dec. 28, 2016 (CN) .......................... 201611243248.6

(51) Int. Cl.
*C23C 14/04*    (2006.01)
*H01L 51/56*    (2006.01)
(Continued)

(52) U.S. Cl.
CPC .......... *C23C 14/042* (2013.01); *B05C 21/005* (2013.01); *G03F 1/64* (2013.01);
(Continued)

(58) Field of Classification Search
None
See application file for complete search history.

(56) References Cited

U.S. PATENT DOCUMENTS

| | | | |
|---|---|---|---|
| 2003/0108805 A1* | 6/2003 | Clark | C23C 14/042 430/22 |
| 2003/0221614 A1* | 12/2003 | Kang | C23C 14/042 118/504 |

(Continued)

FOREIGN PATENT DOCUMENTS

| | | |
|---|---|---|
| CN | 102094168 A | 6/2011 |
| CN | 103695841 A | 4/2014 |

(Continued)

OTHER PUBLICATIONS

International Search Report and Written Opinion dated Mar. 13, 2018; PCT/CN2017/114784.

(Continued)

*Primary Examiner* — Jethro M. Pence

(57) ABSTRACT

A mask frame assembly, including: a hollow frame, which is provided with a hollow area; and a first howling stick, disposed across the hollow area of the hollow frame in a first direction; wherein the mask frame assembly is configured to support a fine metal mask plate which includes a mask pattern area and an invalid mask area surrounding the mask pattern area; in a state of the fine metal mask plate being supported by the mask frame assembly, opposite ends of the fine metal mask plate are fixed on the hollow frame in a second direction; the mask pattern area of the fine metal mask plate is disposed in the hollow area of the hollow frame; and a projection of the first howling stick on the fine (Continued)

metal mask plate is in the invalid mask area. An evaporation device is also disclosed.

14 Claims, 7 Drawing Sheets

(51) Int. Cl.
    *G03F 1/64*      (2012.01)
    *G03F 7/20*      (2006.01)
    *B05C 21/00*      (2006.01)
    *H01L 51/00*      (2006.01)

(52) U.S. Cl.
    CPC ............ *G03F 7/2014* (2013.01); *H01L 51/56* (2013.01); *H01L 51/0011* (2013.01)

(56) References Cited

U.S. PATENT DOCUMENTS

| | | | |
|---|---|---|---|
| 2010/0192856 A1* | 8/2010 | Sung | C23C 14/042 118/721 |
| 2011/0048323 A1* | 3/2011 | Kondo | C23C 14/042 118/500 |
| 2011/0139069 A1* | 6/2011 | Ahn | G03F 1/20 257/E33.001 |
| 2011/0146573 A1* | 6/2011 | Park | C23C 14/042 118/712 |
| 2011/0220019 A1* | 9/2011 | Lee | C23C 14/042 118/504 |
| 2012/0279444 A1* | 11/2012 | Hong | C23C 14/042 118/504 |
| 2012/0325143 A1* | 12/2012 | Kang | C23C 14/042 118/504 |
| 2012/0329188 A1* | 12/2012 | Sonoda | C23C 14/042 118/500 |
| 2014/0120796 A1* | 5/2014 | Kim | G03F 1/22 445/66 |
| 2014/0370196 A1* | 12/2014 | Kim | B05D 1/32 118/504 |
| 2015/0101536 A1* | 4/2015 | Han | C23C 14/042 118/721 |
| 2016/0005970 A1* | 1/2016 | Kwen | C23C 14/042 118/504 |
| 2016/0079532 A1* | 3/2016 | Yi | H01L 51/0002 438/758 |
| 2016/0079568 A1* | 3/2016 | Han | C23C 18/1616 438/34 |
| 2016/0122860 A1* | 5/2016 | Kim | C23C 14/042 118/505 |
| 2017/0207390 A1* | 7/2017 | Kim | C23C 14/24 |
| 2017/0222145 A1* | 8/2017 | Kim | B05C 21/005 |
| 2017/0282212 A1* | 10/2017 | Kang | B05C 21/005 |
| 2017/0365822 A1* | 12/2017 | Kim | H01L 27/3246 |
| 2018/0023183 A1* | 1/2018 | Kang | C23C 14/042 118/720 |
| 2018/0026189 A1* | 1/2018 | Kim | H01L 51/56 438/401 |
| 2018/0040857 A1* | 2/2018 | Hong | H01L 51/56 |
| 2018/0080114 A1 | 3/2018 | Chang | |
| 2018/0198066 A1* | 7/2018 | Lin | C23C 14/06 |
| 2018/0202034 A1* | 7/2018 | Lin | C23C 14/042 |
| 2018/0209029 A1* | 7/2018 | Lin | C23C 14/042 |
| 2019/0010599 A1* | 1/2019 | Lin | H01L 51/0011 |
| 2019/0062895 A1* | 2/2019 | Zhang | B23K 1/0008 |
| 2019/0078193 A1* | 3/2019 | Lin | C23C 14/042 |
| 2019/0126406 A1* | 5/2019 | Litoshenko | B23K 26/0626 |
| 2019/0177831 A1* | 6/2019 | Lin | C23C 14/24 |
| 2019/0301001 A1* | 10/2019 | Zhang | H01L 51/0011 |
| 2019/0378983 A1* | 12/2019 | Kim | H01L 51/56 |
| 2020/0032382 A1* | 1/2020 | Li | C23C 14/042 |
| 2020/0144530 A1* | 5/2020 | Kim | C23C 14/12 |
| 2020/0238323 A1* | 7/2020 | Jo | B05B 12/20 |
| 2021/0164087 A1* | 6/2021 | Lin | G03F 1/64 |
| 2021/0175424 A1* | 6/2021 | Qi | C23C 14/042 |
| 2021/0207257 A1* | 7/2021 | Jin | C23C 14/04 |
| 2021/0210735 A1* | 7/2021 | Kang | C23C 14/24 |
| 2021/0391541 A1* | 12/2021 | Kim | H01L 51/0011 |
| 2021/0404079 A1* | 12/2021 | Xiao | C23C 14/042 |
| 2022/0052127 A1* | 2/2022 | Park | H01L 27/3218 |

FOREIGN PATENT DOCUMENTS

| | | |
|---|---|---|
| CN | 203960317 U | 11/2014 |
| CN | 105826469 A | 8/2016 |
| CN | 205420527 U | 8/2016 |
| CN | 106086782 A | 11/2016 |
| CN | 106480404 A | 3/2017 |
| CN | 206279261 U | 6/2017 |
| JP | 04256336 A | 9/1992 |
| KR | 20100000129 A | 1/2010 |

OTHER PUBLICATIONS

First Chinese Office Action dated Jun. 5, 2018; Appln. No. 201611243248.6.

* cited by examiner

A-A

MASK FRAME ASSEMBLY AND EVAPORATION DEVICE

TECHNICAL FIELD

Embodiments of the present disclosure relate to a mask frame assembly and an evaporation device.

BACKGROUND

The OLED (Organic Light Emitting Diode) display panel has many advantages such as being self-luminous, having fast response and high brightness, being light and thin, and the like, and has gradually become the mainstream in the display field.

The OLED display panel comprises a plurality of sub-pixel units arranged in an array. Each sub-pixel unit comprises an anode, a light-emitting layer, and a cathode. The light-emitting layer is formed of an organic electroluminescent material, and is currently formed in each sub-pixel unit through an evaporation process by a mask plate. The mask plate has a pattern thereon. As the PPI (Pixels Per Inch, the number of pixels per inch) of the screen increases, the pattern area on the mask plate is further refined to form a fine metal mask plate (FMM, fine metal mask).

During the evaporation process, a plurality of fine metal mask plates required to be welded on a frame to form a mask frame assembly (MFA), and the mask frame assembly is placed into an evaporation machine during use.

When the fine metal mask plate is manufactured, outward pulling forces are applied at opposite sides for fixing the fine metal mask plate to make the fine metal mask plate in tension, and the fine metal mask plate, which is in tension, is welded on the frame to form a mask frame assembly.

SUMMARY

At least one embodiment of the present disclosure provides a mask frame assembly, comprising: a hollow frame, which is provided with a hollow area; and a first howling stick, disposed across the hollow area of the hollow frame in a first direction; wherein the mask frame assembly is configured to support a fine metal mask plate which comprises a mask pattern area and an invalid mask area surrounding the mask pattern area; in a state of the fine metal mask plate being supported by the mask frame assembly, opposite ends of the fine metal mask plate are fixed on the hollow frame in a second direction; the mask pattern area of the fine metal mask plate is disposed in the hollow area of the hollow frame; and a projection of the first howling stick on the fine metal mask plate is in the invalid mask area.

In one embodiment of the present disclosure, the first howling stick is provided with a groove; the invalid mask area of the fine metal mask plate intersecting with the first howling stick is in the groove; and a depth of the groove is greater than or equal to a thickness of the fine metal mask plate.

In one embodiment of the present disclosure, both of the first howling stick and the fine metal mask plate are fixed on an upper surface of the hollow frame.

In one embodiment of the present disclosure, the fine metal mask plate is fixed on an upper surface of the hollow frame, and the first howling stick is fixed on an inner surface of the hollow frame.

In one embodiment of the present disclosure, there is a gap between an edge of the groove and the fine metal mask plate located in the groove.

In one embodiment of the present disclosure, the fine metal mask plate is rectangular, and the first direction and the second direction are perpendicular to each other.

In one embodiment of the present disclosure, the mask frame assembly comprises at least two first howling sticks, and the at least two first howling sticks are disposed in parallel with each other.

In one embodiment of the present disclosure, the mask frame assembly is configured to support at least two fine metal mask plates, and the at least two fine metal mask plates are arranged in parallel with each other.

In one embodiment of the present disclosure, the mask frame assembly further comprises a second howling stick configured to support the first howling stick, the second howling stick is disposed on the hollow frame in a third direction, and a projection of the second howling stick in a direction perpendicular to the hollow frame is located outside a projection of the mask pattern area of the fine metal mask plate in the direction perpendicular to the hollow frame.

In one embodiment of the present disclosure, the third direction is perpendicular to the first direction.

In one embodiment of the present disclosure, when the mask frame assembly is configured to support at least two fine metal mask plates, the second howling stick is disposed between two adjacent fine metal mask plates and the width of the second howling stick is greater than or equal to a width of the gap between the two adjacent fine metal mask plates.

At least one embodiment of the present disclosure provides an evaporation device, comprising an evaporation chamber and an evaporation source and a magnetic spacer provided in the evaporation chamber, and further comprising any mask frame assembly mentioned above, wherein the mask frame assembly is disposed in the evaporation chamber and positioned between the magnetic spacer and the evaporation source.

BRIEF DESCRIPTION OF THE DRAWINGS

In order to clearly illustrate the technical solutions of the embodiments of the disclosure, the drawings of the embodiments will be briefly described in the following; it is obvious that the drawings described below are only related to some embodiments of the disclosure and thus are not limitative of the disclosure.

REFERENCE NUMERALS

01—frame;
02—substrate to be vapor-deposited;
03—howling stick;
04—magnetic spacer;
05—evaporation chamber;
06—evaporation source;
07—mask frame assembly
10—hollow frame;
20—fine metal mask plate;
30—first howling stick;
31—groove;
40—second howling stick;
C—mask pattern area;
D, D'—invalid mask area;
E—gap between an edge of the groove and the fine metal mask plate in the groove;
F—width of the second howling stick;
H—width of the gap between two adjacent fine metal mask plates;
I—first direction;
J—second direction;
K—third direction;
P—gap between the fine metal mask plate and the substrate to be vapor-deposited;
T—depth of the groove;
W—thickness of the fine metal mask plate;
X—hollow area;
α—angle between the first direction and the second direction.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Figure 1:
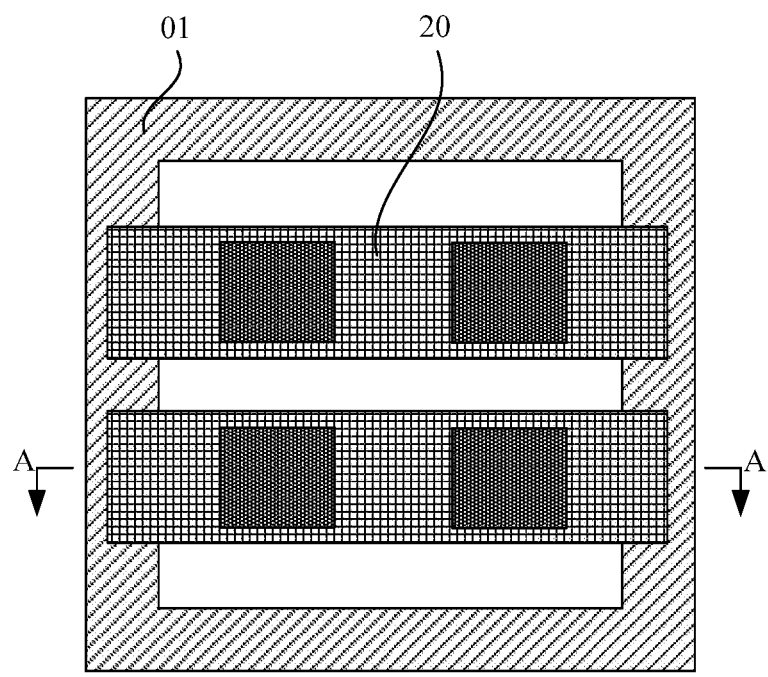
FIG. 1 is an illustrative structural view of a mask frame assembly known by the inventor in the art.
Figure 2:
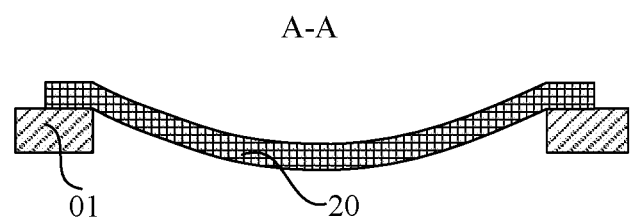
FIG. 2 is a sectional view of A-A in FIG. 1.
Figure 3:
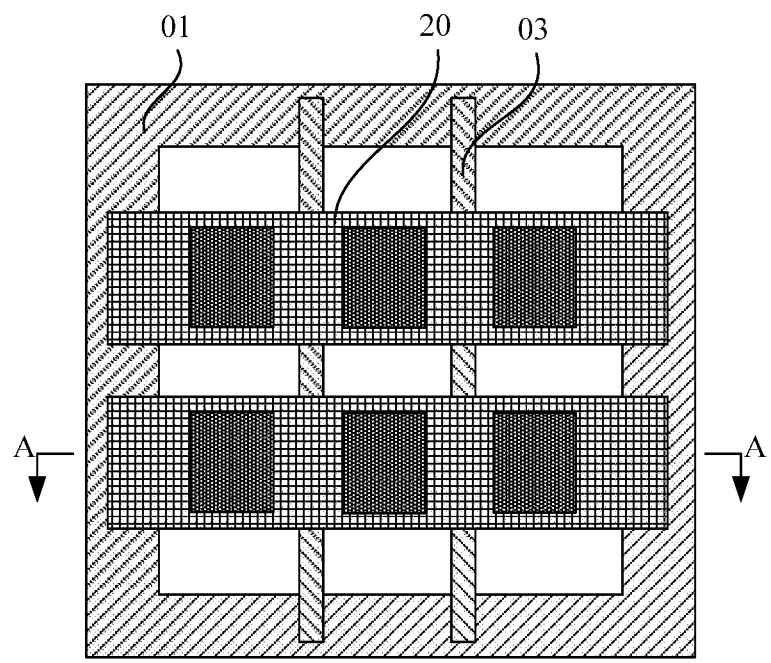
FIG. 3 is an illustrative structural view of a mask frame assembly provided with a howling stick known by the inventor in the art.
Figure 4:
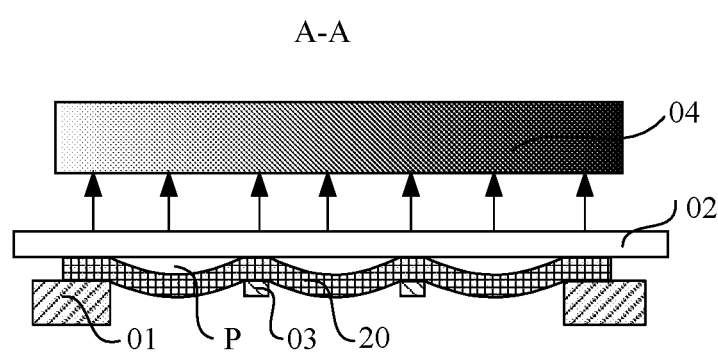
FIG. 4 is a sectional view of A-A in FIG. 3.

The mask frame assembly as illustrated in FIG. 1 is formed by a frame 01 and fine metal mask plates 20 welded on the frame 01. As illustrated in FIG. 2, to mitigate the problem of sagging of the suspended portion of the fine metal mask plate 20 welded on the frame 01 due to gravity, as illustrated in FIG. 3, in the art known by the inventors, a plurality of howling sticks 03 are provided on the frame 01 to which the fine metal mask plates 20 are welded and are used to support the suspended portions of the fine metal mask plates 20. As illustrated in FIG. 4, after the mask frame assembly is put into the evaporation chamber, a substrate 02 to be vapor-deposited is placed above the mask frame assembly and the fine metal mask plate 20 and the substrate 02 to be vapor-deposited are made to be in close contact with each other by a magnetic suction force of a magnetic spacer 04 above the substrate 02 to be vapor-deposited, and the evaporation operation is performed under the effect of the magnetic suction force.

Thus, as illustrated in FIG. 4, the fine metal mask plate 20 is brought close to the substrate 02 to be vapor-deposited by the magnetic suction force of the magnetic spacer 04. Due to the fact that the positions on the fine metal mask plate 20 corresponding to the plurality of howling sticks 03 and the substrate 02 to be vapor-deposited are in close contact with each other and thus cannot be displaced, there is no space for shrinking of the sag amount of the fine metal mask plate 20, resulting in a large gap P between the substrate 02 to be vapor-deposited and the fine metal mask 20 in the portion between the frame 01 and the howling sticks 03. In the evaporation process, the evaporation material easily accumulates at the position of the gap P, which in turn causes a poor lateral Mura on the resultant OLED display panel, which may affect the production yield of the OLED display panel.

Figure 5:
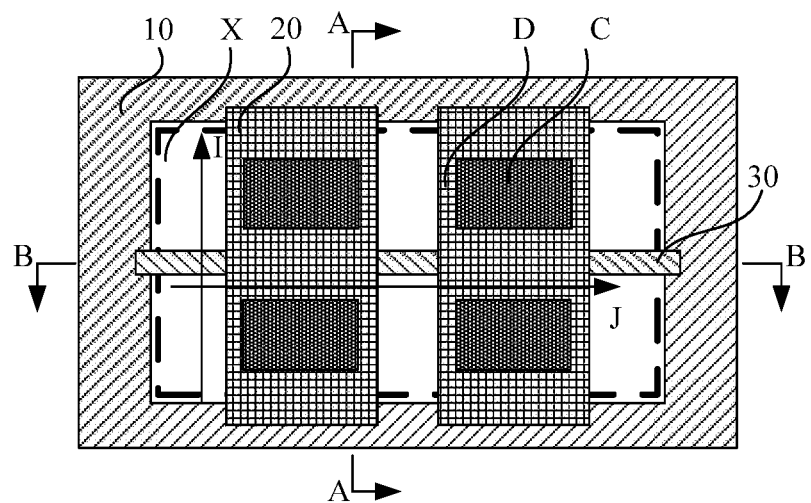
FIG. 5 is an illustrative structural view of a mask frame assembly according to one embodiment of the present disclosure.

At least one embodiment of the present disclosure provides a mask frame assembly, as illustrated in FIG. 5, comprising a hollow frame 10 provided with a hollow area X; and a first howling stick 30 with both ends arranged on the hollow frame 10, wherein the first howling stick 30 is disposed across the hollow area X of the hollow frame 10 in the first direction J. The mask frame assembly is configured to support the fine metal mask plate 20 which comprises a mask pattern area C and an invalid mask area D surrounding the mask pattern area. When being supported, opposite ends of the fine metal mask plate 20 are fixed on the hollow frame 10, and the fine metal mask plate 20 is disposed across the hollow area X of the hollow frame 10 in the second direction I. The first howling stick 30 is configured to support the fine metal mask plate 20 in the invalid mask area D of the fine metal mask plate 20. The first direction I intersects with the second direction J.

Figure 6:
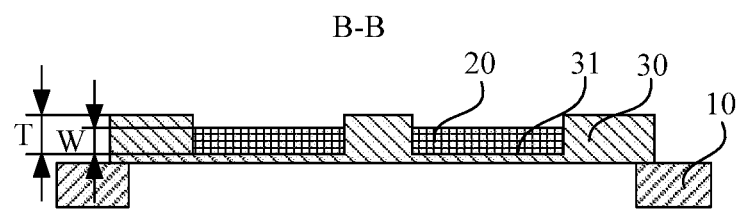
FIG. 6 is a first sectional view of B-B in FIG. 5.

In one embodiment of the present disclosure, as illustrated in FIG. 6, the first howling stick 30 is provided with a groove 31. The invalid mask area D of the fine metal mask plate 20 is supported in the groove 31. The depth T of the groove 31 is greater than or equal to the thickness W of the fine metal mask plate 20.

Firstly, it should be noted that the hollow frame 10 is usually a rectangular frame, and a rectangular hollow area X is provided in the center of the rectangular frame. However, the shape of the hollow frame 10 and the shape of the hollow area X provided on the hollow frame 10 are not limited in the present disclosure. The hollow frame 10 and the hollow area X provided on the hollow frame 10 can be set according to the shape to be subjected to evaporation of the substrate to be vapor-deposited, as long as a hollow area can be provided in the hollow frame 10, so that the mask pattern area C of the fine metal mask plate 20 can be supported in the hollow area X.

Secondly, as illustrated in FIG. 5, the fine metal mask plate 20 operatively supported by the mask frame assembly is generally an elongated metal sheet, and the fine metal mask plate 20 comprises a plurality of mask pattern areas C thereon, each of which is surrounded by the invalid mask area D. The portion of the fine metal mask plate 20 other than the mask pattern area C is an invalid mask area D. When performing the evaporation operation, the evaporation material is adhered to the corresponding positions on the substrate to be vapor-deposited through the mask pattern area C on the fine metal mask plate 20 so as to form a desired pattern on the substrate to be vapor-deposited. Therefore, the mask frame assembly is configured that both fixed ends for fixing the fine metal mask plate 20 and support points of the first howling stick 30 for supporting the fine metal mask plate 20 are all disposed in the invalid mask area D, and so that the pattern is formed on the substrate to be vapor-deposited with the evaporation operation being not affected.

Thirdly, the first howling stick 30 is disposed across the hollow area X of the hollow frame 10, and is configured to support the fine metal mask plate 20 when the mask frame assembly is operated to support the fine metal mask plate 20. Therefore, the first howling stick 30 is disposed below the fine metal mask plate 20, and at least partially overlaps with a vertical projection of the fine metal mask plate 20. Thus, when the fine metal mask plate 20 is sagged and deformed due to gravity, the sagging portion will rest on the position where the first howling stick 30 overlaps with the vertical projection of the fine metal mask plate 20 and be supported by the first howling stick 30, thereby reducing the deformation amount of the sagging due to gravity.

Fourthly, when the hollow frame 10 is a rectangular frame, as illustrated in FIG. 5, the fine metal mask plate 20 disposed along the second direction I has two fixed ends which are respectively fixed on two opposite sides of the hollow frame 10; and the first howling stick 30 disposed along the first direction J has two fixed ends which are fixed on the other two opposite sides of the hollow frame 10 except for the opposite sides for fixing the fine metal mask plate 20. The first direction J and the second direction I are in a state of intersecting with each other. "Intersecting" here means that an orthogonal projection of the fine metal mask plate 20 intersects with an orthogonal projection of the first howling stick 30, comprising the fine metal mask plate 20 and the first howling stick 30 contact each other at the intersecting position and further comprising the fine metal mask plate 20 and the first howling stick 30 do not contact each other. For another example, when the hollow frame 10 is a polygon, as long as the two fixed ends of the fine metal mask plate 20 and the two fixed ends of the first howling stick 30 are fixed on different sides of the hollow frame 10 respectively along the first direction J and the second direction I, and there is an intersection between the first direction J and the second direction I, so that the first howling stick 30 can support the sagging of the fine metal mask plate 20. In addition, the first direction J and the second direction I intersecting with each other can also be understood as a line where the first direction J lies and a line where the second direction I lies intersecting with each other. Likewise, the third direction K and the second direction I being perpendicular to each other as mentioned below can also be understood as a line where the third direction K lies and a line where the second direction I lies being perpendicular to each other. Those skilled in the art would appreciate that an arrangement direction of the fine metal mask plate 20 and an arrangement direction of the first howling stick are intersected with each other.

Figure 7:
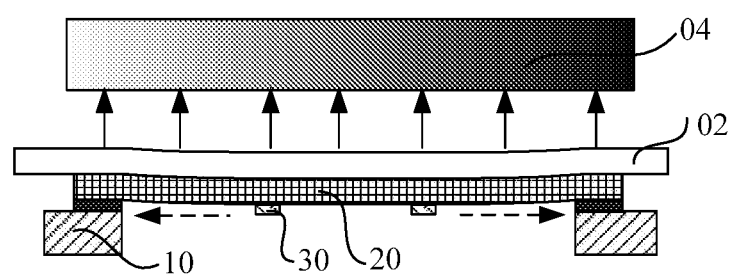
FIG. 7 is a sectional view of A-A in FIG. 5 in which a magnetic spacer and a substrate to be deposited are provided.

Fifthly, as illustrated in FIG. 6 and FIG. 7, only if the depth T of the groove 31 is slightly greater than or equal to the thickness W of the fine metal mask plate 20, the sagging deformation of the fine metal mask plate 20 due to the gravity can be recovered during operation. When the magnetic suction force of the magnetic spacer 04 pulls the fine metal mask plate 20 upward to bring it in close proximity to the substrate 02 to be vapor-deposited until the two fixed ends of the fine metal mask plate 20 are in close contact with the substrate 02 to be vapor-deposited, the first howling stick 30 is also subjected to an upward magnetic suction force, which is pulled upwardly close to the substrate 02 to be vapor-deposited. Since the fine metal mask plate 20 is located in the groove 31, an upper surface of the groove 31 has an upward thrust on the sagging deformation portion of the fine metal mask plate 20 due to gravity, which upward thrust counteracts a part of the gravity of the fine metal mask plate 20, and the force to stretch both sides of the fine metal mask plate 20 (indicated by the dashed arrows in FIG. 7) can restore a part of the sagging deformation due to gravity. Since there is still a gap between the upper surface of the fine metal mask plate 20 and the lower surface of the substrate 02 to be vapor-deposited at the groove 31, the fine metal mask plate 20 can be laterally moved by a tensile force. When the depth T of the groove 31 is equal to the thickness W of the fine metal mask plate 20, movement of the portion of the fine metal mask plate 20 at the position corresponding to the groove 31 under the action of the tensile force would at first need overcome a frictional resistance with the upper surface of the groove 31, which will cause a part of the tensile force to be counteracted by the frictional resistance, thereby reducing the recovery amount of the sagging deformation of the fine metal mask plate 20, or would need apply a greater tensile force to the fine metal mask plate 20 so as to recover the sagging deformation of the fine metal mask plate 20. If the depth T of the groove 31 is too much greater than the thickness W of the fine metal mask plate 20, the upper surface of the groove 31 has a relatively small upward thrust on the fine metal mask plate 20, which cannot recover the sagging deformation. Therefore, as illustrated in FIG. 7, the depth T of the groove 31 needs to be slightly greater than the thickness W of the fine metal mask plate 20.

At least one embodiment of the present disclosure provides a mask frame assembly comprising a hollow frame provided with a hollow area; and the first howling stick disposed across the hollow area of the hollow frame in the first direction, wherein the mask frame assembly is configured to support the fine metal mask plate which comprises thereon a mask pattern area and an invalid mask area surrounding the mask pattern area, when the fine metal mask plate is supported by the howling stick, opposite ends of the fine metal mask plate are fixed on the hollow frame, and the fine metal mask plate is disposed across the hollow area of the hollow frame in the second direction; and the first howling stick is disposed across the hollow area of the hollow frame in the first direction, the projection of the first howling stick on the fine metal mask plate is in the invalid mask area, the first howling stick is configured to support the fine metal mask plate; wherein the first howling stick is provided with a groove, the invalid mask area of the fine metal mask plate is located in the groove, the depth of the groove is greater than or equal to the thickness of the fine metal mask plate.

The fine metal mask plate and the first howling stick are disposed on the hollow frame respectively in the second direction and in the first direction, the first howling stick is provided with a groove thereon, the depth of the groove is greater than or equal to the thickness of the fine metal mask plate, the invalid mask area where the fine metal mask plate and the first howling stick are intersected is located in the groove, so that the first howling stick can support the sagging of the suspended portion of the fine metal mask plate due to gravity without obstructing the evaporation by the mask. In addition, when the fine metal mask plate is sucked and attached to the substrate to be vapor-deposited, the fine metal mask plate is subjected to an upward magnetic suction force all over, and the suspended portion of the fine metal mask plate is moved upward by the magnetic suction force, so that the deformation of the fine metal mask plate due to gravity is reduced, and the gap between the suspended portion of the fine metal mask plate and the substrate to be vapor-deposited is reduced, thereby reducing the deposition and the mixing of the evaporation material in the gap during the evaporation process, and thus reducing the chance of a horizontal Mura defect on the vapor-deposited substrate.

In one embodiment of the present disclosure, as illustrated in FIG. 5, both of the first howling stick 30 and the fine metal mask plate 20 are fixed on the upper surface of the hollow frame 10. Since the fine metal mask plate 20 of the mask frame assembly is usually welded and fixed on the hollow frame 10 with both ends being stretched, so that the fine metal mask plate 20 is applied a tensile force directed to the two fixed ends on the hollow frame 10, by having the fine metal mask plate 20 welded onto the upper surface of the hollow frame 10, as illustrated by the solid portion filled in black in FIG. 7, the welding joint area can be increased as much as possible, and the fixing stability between the fine metal mask plate 20 and the hollow frame 10 can be further enhanced. Of course, the fine metal mask plate 20 can also be welded onto the inner side wall of the hollow frame 10.

Likewise, as illustrated in FIG. 5, before welding the fine metal mask plate 20, the first howling stick 30 is fixed on the hollow frame 10 by being welded onto the upper surface of the hollow frame 10.

In addition, since the first howling stick 30 is not necessarily fixed on the hollow frame 10 in a stretched state, in case that the first howling stick 30 is strong enough to support the fine metal mask plate 20, the first howling stick 30 can be fixedly disposed onto the inner side wall of the hollow frame 10 by other fixing means. For example, the first howling stick 30 is fixed by a threaded fastening connection. For example, the thickness of the first howling stick 30 is increased to improve the supporting ability of the first howling stick 30, and threaded holes are respectively machined at the two fixed ends of the first howling stick 30, an insertion slot is disposed on the inner side wall of the hollow frame 10 corresponding to the two fixed ends of the first howling stick 30, and the two fixed ends of the first howling stick 30 are respectively inserted into the insertion slots and fixedly connected by the threaded fastening connection member. The threaded fastening connection member can project into a hole formed in the upper surface, the lower surface or the side of the hollow frame 10 and be fastened with the threaded hole.

The present disclosure is only described by taking the fixing connection means of the first howling stick 30 as an example. And the fixing connection means of the first howling stick 30 is not limited in the present disclosure. As long as it is ensured that the first howling stick 30 supports the fine metal mask plate 20 and the evaporation is not affected, those skilled in the art can fix the first howling stick 30 by other fixing means.

Figure 8:
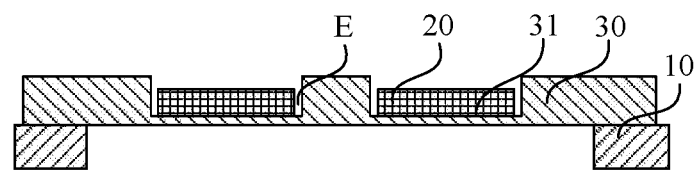
FIG. 8 is a second sectional view of B-B in FIG. 5.

In one embodiment of the present disclosure, in order to reduce the friction resistance between the fine metal mask plate 20 and the side wall of the groove 31 when the fine metal mask plate 20 located in the groove 31 is moved by the tensile force applied to the two ends thereof, as illustrated in FIG. 8, a lateral gap E is provided between the fine metal mask plate 20 and the inner wall of the groove 31.

In this way, in the course of the fine metal mask plate 20 approaching the substrate 02 to be vapor-deposited by moving upward under effect of the magnetic suction force of the magnetic spacer 04, the amount of sagging deformation of the fine metal mask plate 20 located in the groove 31 is restored by the action of the tensile force without a frictional resistance with the groove 31, which improves the restoring degree for the amount of sagging deformation of the fine metal mask plate 20.

Further, as illustrated in FIG. 5, the shape of the fine metal mask plate 20 is rectangular, and the first direction J and the second direction I are perpendicular to each other.

As illustrated in FIG. 5, typically, the shape of the fine metal mask plate 20 is rectangular, and the first howling stick 30 straddling in the first direction J and intersecting with the fine metal mask plate is disposed at the position of the invalid mask area D between two adjacent mask pattern areas C of the fine metal mask plate 20.

Figure 9A:
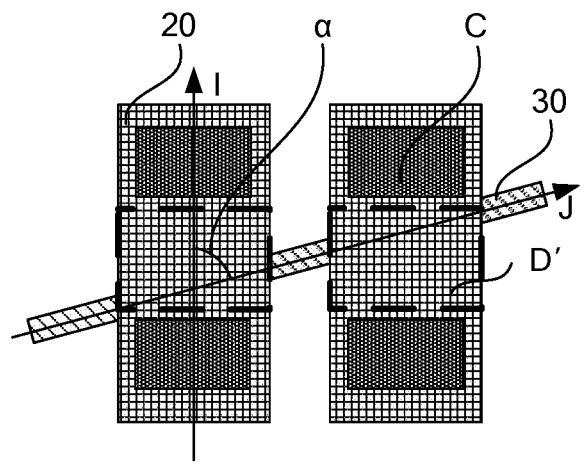
FIG. 9a is an illustrative view of one arrangement of the fine metal mask plate and a first howling stick in a mask frame assembly according to one embodiment of the present disclosure.

As illustrated in FIG. 9a, if an included angle α between the first direction J and the second direction I is less than 90°, as the included angle α becomes small, the invalid mask area D' (as indicated by the dashed box in the figure) between two adjacent mask pattern areas C on the fine metal mask plate 20 must be increased to prevent the first howling stick 30 and the fine metal mask plate 20 from intersecting in the mask pattern area C of the fine metal mask plate 20 and affecting the evaporation effect of the substrate to be vapor-deposited. When a plurality of mask pattern areas C are provided on the fine metal mask plate 20, increasing the invalid mask area D' inevitably reduces the mask pattern area C, thereby reducing the evaporation efficiency of a single evaporation process.

Figure 9B:
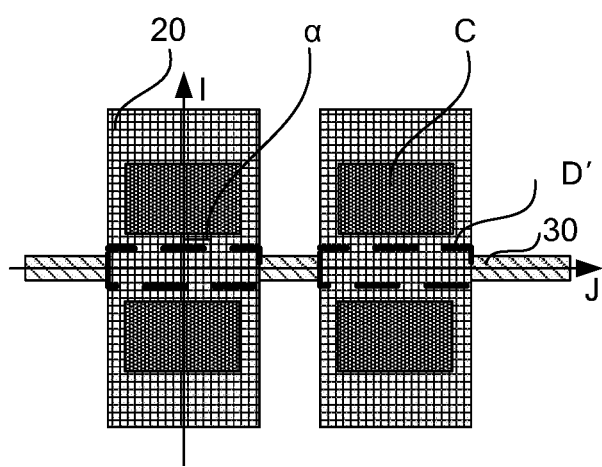
FIG. 9b is an illustrative view of another arrangement of the fine metal mask plate and a first howling stick in a mask frame assembly according to one embodiment of the present disclosure.

As illustrated in FIG. 9b, the first direction J and the second direction I are perpendicular to each other, and then, the invalid mask area D' (as indicated by the dashed box in the figure) between two adjacent mask pattern areas C on the fine metal mask plate 20 can be set as the minimum, which is slightly larger than the width of the first howling stick 30. In this way, the space for the invalid mask area D' can be reduced, thereby increasing the arranging density of the mask pattern area C on the fine metal mask plate 20, and improving the evaporation efficiency of a single process using the fine metal mask plate 20.

Figure 10:
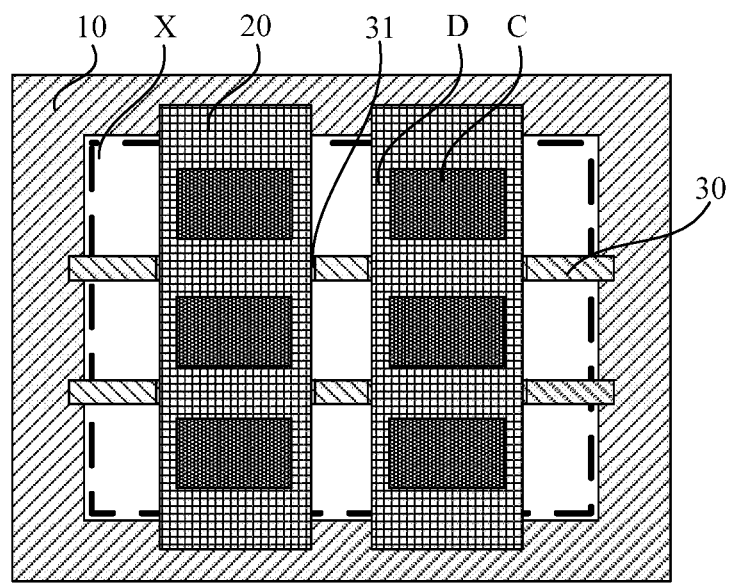
FIG. 10 is an illustrative structural view in which two first howling sticks are provided in the mask frame assembly according to one embodiment of the present disclosure.

In one embodiment of the present disclosure, as illustrated in FIG. 10, the mask frame assembly comprises at least two first howling sticks 30, and two adjacent first howling sticks 30 are parallel with each other.

Thus, as illustrated in FIG. 10, the two first howling sticks 30 are uniformly distributed and disposed in parallel on the position of the invalid mask area D between two adjacent mask pattern areas C on the fine metal mask plate 20, so as to support the fine metal mask plate 20 and further improve the supporting effect of the fine metal mask plate 20 by the first howling sticks 30. The two adjacent first howling sticks 30 are parallel with each other and are respectively disposed in different invalid mask areas D, which will not increase the space for the invalid mask area D between two adjacent mask pattern areas C and thus will not affect the evaporation of the substrate to be vapor-deposited.

In one embodiment of the present disclosure, the mask frame assembly is configured to support at least two fine metal mask plates 20. As illustrated in FIG. 10, at least two fine metal mask plates 20 are provided and two adjacent fine metal mask plates 20 are parallel with each other.

As illustrated in FIG. 10, in order to take full advantage of the hollow area X of the hollow frame 10 and improve the evaporation efficiency of a single evaporation process, the fine metal mask plates 20 are provided in the hollow area X as many as possible. The fine metal mask plates 20 being arranged to be parallel with each other, the number of the fine metal mask plates 20 disposed in the hollow area X can be increased as much as possible, the space of the hollow areas X can be effectively utilized, and a partial overlapping between the adjacent fine metal mask plates 20 can be avoided and the evaporation on the substrate to be processed can be prevented from being affected.

Figure 11:
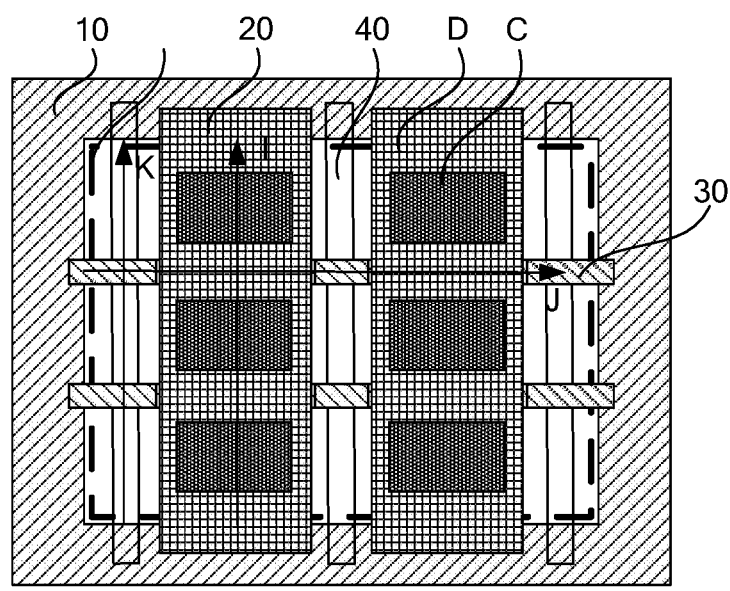
FIG. 11 is an illustrative structural view in which a second howling stick is further provided in the mask frame assembly according to one embodiment of the present disclosure.

Further, as illustrated in FIG. 11, the mask frame assembly further comprises a second howling stick 40. Both ends of the second howling stick 40 are disposed on the hollow frame 10, and the second howling stick 40 is disposed across the hollow area X of the hollow frame 10 in the third direction K, and is positioned below the first howling stick 30 to support the first howling stick 30. In order to prevent the second howling stick 40 from shielding the evaporation pattern of the fine metal mask plate 20, the projection of the second howling stick in a direction perpendicular to the mask frame assembly and the projection of the mask pattern area C in the direction perpendicular to the mask frame assembly do not overlap with each other.

It should be noted that, the position and the arrangement manner of the second howling stick 40 on the hollow frame 10 are not limited in the present disclosure. The second howling stick 40 can be disposed on the upper surface, the lower surface or the inner side wall of the hollow frame 10 by welding, attaching, or threaded fastening and etc.

As illustrated in FIG. 11, the second howling stick 40 is fixedly connected on the upper surface of the hollow frame 10 and is disposed below the first howling stick 30 to support the first howling stick 30. The second howling stick 40 is disposed across the hollow area X of the hollow frame 10 and has a projection in the direction perpendicular to the mask frame assembly located outside the projection of the mask pattern area C in the direction perpendicular to the mask frame assembly, so as to avoid shielding the evaporation pattern of the fine metal mask plate 20 during the evaporation process.

For example, as illustrated in FIG. 11, the third direction K is perpendicular to the second direction I. Thus, on the one hand, reinforcement of the first howling stick 30 can be improved by the second howling stick 40. On the other hand, since the first direction J is perpendicular to the second direction I, the third direction K which is perpendicular to the second direction I is parallel with the first direction J, thus the space between two adjacent second metal mask plates 20 which is occupied by the second howling stick 40 can be reduced.

Figure 12:
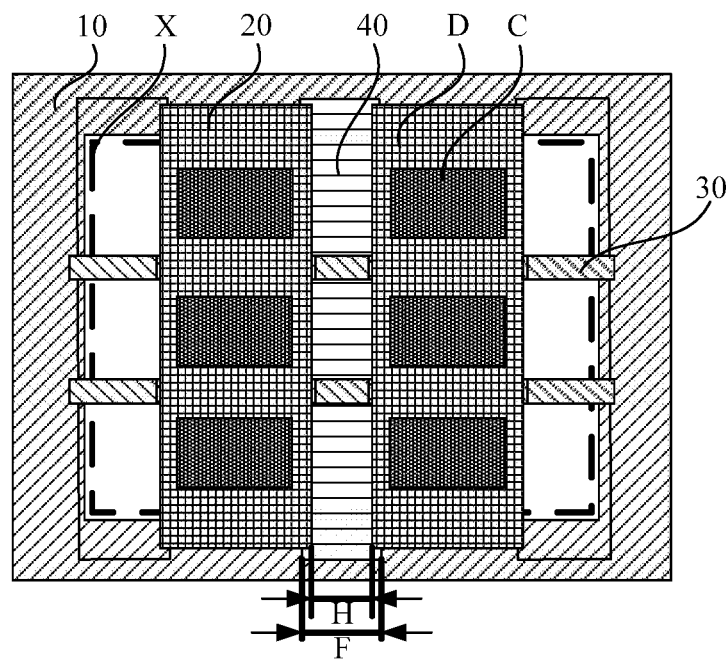
FIG. 12 is an illustrative structural view in which the second howling stick has a width greater than or equal to a gap width between two adjacent fine metal mask plates in the mask frame assembly according to one embodiment of the present disclosure.

Further, as illustrated in FIG. 12, when at least two fine metal mask plates 20 are provided, the second howling stick 40 is disposed between two adjacent fine metal mask plates 20, and the width F of the second howling stick 40 is greater than or equal to the width H of the gap between two adjacent fine metal mask plates 20. When the width F of the second howling stick 40 is greater than the width H of the gap between two adjacent fine metal mask plates 20, there is an overlap between the orthographic projections of a part of the invalid mask areas D of the two adjacent fine metal mask plates 20 and the second howling stick 40 in a plane in which the hollow frame 10 lies.

Thus, the second howling stick 40 disposed between the two adjacent fine metal mask plates 20 can cover the space between the two adjacent fine metal mask plates 20 from the lower surface of the fine metal mask plate 20. When performing evaporation on the substrate to be vapor-deposited through the mask frame assembly according to the present disclosure, the evaporation material vaporized from the evaporation source is adhered to the lower surface of the substrate to be vapor-deposited by passing through the permeable portion of the mask pattern area C on the fine metal mask plate 20. Since the second howling stick 40 is disposed between two adjacent fine metal mask plates 20, and the width F of the second howling stick 40 is greater than or equal to the width H of the gap between the two adjacent fine metal mask plates 20, the second howling stick 40 acts as a shield to the gap between two adjacent fine metal mask plates 20 and avoids deposition of the evaporation material evaporated from the evaporation source on the position of the substrate to be vapor-deposited corresponding to the gap between two adjacent fine metal mask plates 20, and thereby improving the evaporation accuracy for the substrate to be vapor-deposited.

Further, as illustrated in FIG. 12, when the width F of the second howling stick 40 is greater than the width H of the gap between two adjacent fine metal mask plates 20, there is an overlap between the orthographic projection of the second howling stick 40 in the plane in which the hollow frame 10 lies and the orthographic projection of the invalid mask areas D of the two adjacent fine metal mask plates 20 in the plane in which the hollow frame 10 lies, and thus the mask pattern area C of the fine metal mask plate 20 will not be covered, namely, the evaporation pattern on the substrate to be vapor-deposited will not be affected.

Figure 13:
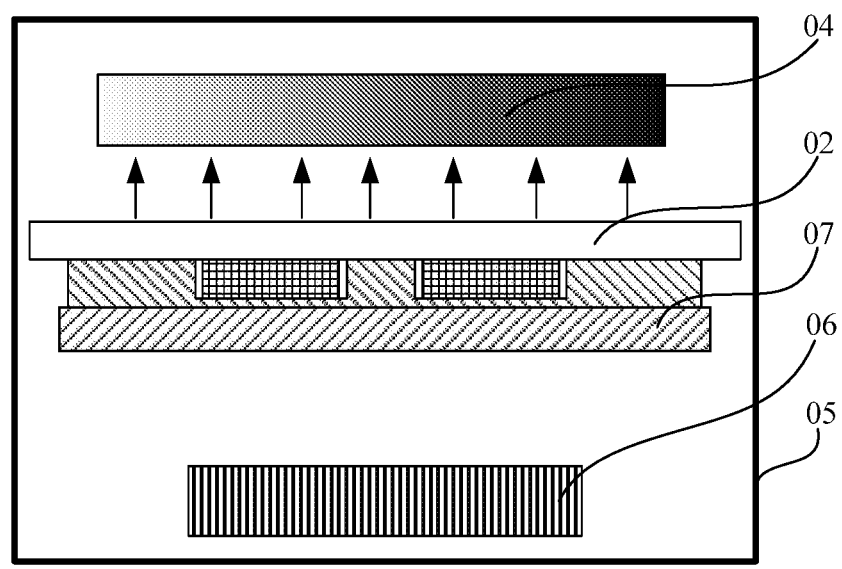
FIG. 13 is an illustrative structural view of an evaporation device according to one embodiment of the present disclosure.

At least one embodiment of the present disclosure provides an evaporation device, as illustrated in FIG. 13, comprising an evaporation chamber 05 and an evaporation source 06 provided in the evaporation chamber 05, and further comprising the above-described mask frame assembly which is disposed in the evaporation device and positioned above the evaporation source 06.

In one embodiment of the present disclosure, the evaporation device further comprises a magnetic spacer 04 disposed inside the evaporation chamber and positioned above the mask frame assembly.

As illustrated in FIG. 13, the mask frame assembly 07 according to the embodiments of the present disclosure is placed into the evaporation chamber 05 of the evaporation device, and the substrate to be vapor-deposited 02 is placed above the mask frame assembly 07. Firstly, as illustrated in FIG. 8, the mask frame assembly 07 is sucked by the magnetic spacer 04. Since the groove 31 is provided on the first howling stick 30 at the position corresponding to the fine metal mask plate 20, by the suction force of the magnetic spacer 04, the fine metal mask plate 20 can restore a part of the sagging deformation caused by gravity, thereby reducing the gap between the mask frame assembly 07 and the substrate 02 to be vapor-deposited as much as possible. In this way, the substrate 02 to be vapor-deposited is vapor-deposited in the evaporation chamber 05, so that the accumulation of evaporation material vaporized from the evaporation source 06 at the gap between the mask frame assembly 07 and the substrate 02 to be vapor-deposited can be reduced as much as possible, thereby reducing the occurrence of lateral Mura defect on the manufactured OLED display panel and improving the production yield of the OLED display panel.

In the above description of the specific arrangement and the operation process of the mask frame assembly 07, the evaporation device and the evaporation process thereof have been described in detail, and will not be repeated here.

The foregoing are merely exemplary embodiments of the disclosure, but are not used to limit the protection scope of the disclosure. The protection scope of the disclosure shall be defined by the attached claims.

The present disclosure claims priority of Chinese Patent Application No. 201611243248.6 filed on Dec. 28, 2016, the disclosure of which is hereby entirely incorporated by reference as a part of the present disclosure.

The invention claimed is:

1. A mask frame assembly, comprising:
a hollow frame, which is provided with a hollow area; and
a first howling stick, disposed across the hollow area of the hollow frame in a first direction;
wherein the mask frame assembly is configured to support a fine metal mask plate which comprises a mask pattern area and an invalid mask area surrounding the mask pattern area;
in a state of the fine metal mask plate being supported by the mask frame assembly, opposite ends of the fine metal mask plate are fixed on the hollow frame in a second direction;
the mask pattern area of the fine metal mask plate is disposed in the hollow area of the hollow frame;
a projection of the first howling stick on the fine metal mask plate is in the invalid mask area;
wherein the first howling stick is provided with a groove; the invalid mask area of the fine metal mask plate intersecting with the first howling stick is in the groove; and
a depth of the groove is greater than or equal to a thickness of the fine metal mask plate.

2. The mask frame assembly according to claim 1, wherein both of the first howling stick and the fine metal mask plate are fixed on an upper surface of the hollow frame.

3. The mask frame assembly according to claim 1, wherein the fine metal mask plate is fixed on an upper surface of the hollow frame, and the first howling stick is fixed on an inner surface of the hollow frame.

4. The mask frame assembly according to claim 1, wherein there is a gap between an edge of the groove and the fine metal mask plate located in the groove.

5. The mask frame assembly according to claim 1, wherein the fine metal mask plate is rectangular, and the first direction and the second direction are perpendicular to each other.

6. The mask frame assembly according to claim 1, comprising at least two first howling sticks, and the at least two first howling sticks are disposed in parallel with each other.

7. The mask frame assembly according to claim 1, wherein the mask frame assembly is configured to support at least two fine metal mask plates, and the at least two fine metal mask plates are arranged in parallel with each other.

8. The mask frame assembly according to claim 1, further comprising a second howling stick configured to support the first howling stick, the second howling stick is disposed on the hollow frame in a third direction, and a projection of the second howling stick in a direction perpendicular to the hollow frame is located outside a projection of the mask pattern area of the fine metal mask plate in the direction perpendicular to the hollow frame.

9. The mask frame assembly according to claim 8, wherein the third direction is perpendicular to the first direction.

10. The mask frame assembly according to claim 8, wherein when the mask frame assembly is configured to support at least two fine metal mask plates, the second howling stick is disposed between two adjacent fine metal mask plates and the width of the second howling stick is greater than or equal to a width of the gap between the two adjacent fine metal mask plates.

11. An evaporation device, comprising an evaporation chamber and an evaporation source provided in the evaporation chamber, and further comprising the mask frame assembly according to claim 1, wherein the mask frame assembly is disposed in the evaporation chamber and positioned above the evaporation source.

12. The evaporation device according to claim 11, further comprising a magnetic spacer positioned in the evaporation chamber, the magnetic spacer is positioned above the mask frame assembly.

13. The mask frame assembly according to claim 2, wherein there is a gap between an edge of the groove and the fine metal mask plate located in the groove.

14. The mask frame assembly according to claim 3, wherein there is a gap between an edge of the groove and the fine metal mask plate located in the groove.

* * * * *